United States Patent [19]

Hughes

[11] 3,757,136

[45] Sept. 4, 1973

[54] DIRECT COUPLED LOGARITHMIC VIDEO AMPLIFIER

[75] Inventor: Richard Smith Hughes, Ridgecrest, Calif.

[73] Assignee: The United States of America as represented by the Secretary of the Army, Washington, D.C.

[22] Filed: Dec. 20, 1971

[21] Appl. No.: 209,840

[52] U.S. Cl. .................. 307/229, 307/230, 328/145, 330/30 D

[51] Int. Cl. .......................................... H03k 17/00

[58] Field of Search ............................ 330/30 D, 69; 328/145; 307/229, 230

[56] References Cited

UNITED STATES PATENTS

| | | | |
|---|---|---|---|
| 3,477,031 | 11/1969 | Nagata | 330/30 D |
| 3,168,708 | 2/1965 | Williams et al. | 330/30 D |

FOREIGN PATENTS OR APPLICATIONS

| | | | |
|---|---|---|---|
| 901,467 | 7/1962 | Great Britain | 328/145 |
| 865,466 | 4/1961 | Great Britain | 328/145 |

*Primary Examiner*—John W. Huckert
*Assistant Examiner*—B. P. Davis
*Attorney*—R. S. Sciascia, Roy Miller et al.

[57] ABSTRACT

A high duty cycle logarithmic amplifier having differential amplifier stages wherein the stages are direct coupled, i.e., not capacitive coupled.

6 Claims, 2 Drawing Figures

DIRECT COUPLED LOGARITHMIC VIDEO AMPLIFIER

BACKGROUND OF THE INVENTION

Logarithmic video amplifiers are widely used in pulse receivers that require instantaneous pulse processing, e.g., radar direction finding and laser range finding. The logarithmic amplifier instantaneously compresses a large input dynamic range into a smaller output dynamic range, e.g., logarithmic video amplifiers that instantaneously compress a 100 db input dynamic range into a 20 db output dynamic range are not uncommon.

If linear amplification is used, saturation is a limitation to the maximum usefulness of the system. The input and output dynamic range for linear amplifiers is limited at the low end by the signal-to-noise (S/N) ratio wanted and at the high end by saturation. The output of the linear amplifier must usually exceed a given threshold before it is usable. Thus, the output dynamic range will be the saturation level minus the threshold level.

The total input dynamic range for linear amplifiers may be increased by the use of variable gain control, i.e., lower the gain as the output nears saturation; however, the instantaneous input dynamic range for most linear amplifiers is usually less than 30 db, which is too low for many applications. The term db is defined as: $db = 20 \log x$, where $X$ is any real number greater than zero. This limited input dynamic range may be greatly increased by the use of logarithmic amplifiers.

It is possible to obtain input dynamic ranges greater than 100 db with properly designed logarithmic amplifiers. The output dynamic range of logarithmic amplifiers has the same constraints as linear amplifiers, i.e., 20 to 30 db. Thus the logarithmic amplifier instantaneously compresses a large input dynamic range into a small output dynamic range.

The input dynamic range of a logarithmic amplifier is of primary importance in many designs. The input dynamic range is limited by the input thermal noise at the low end and by saturation of the logarithmic amplifier at the high end. The output dynamic range is defined as the ratio of the maximum output (where the output starts deviating from a logarithmic response) to the minimum output (where the output enters the logarithmic response).

Prior logarithmic video amplifiers require many stages that must be capacitive coupled to achieve the wanted input dynamic range. In capacitive coupled amplifiers there is always a certain amount of differentiation of the pulse regardless of the capacitor values. FIG. 1 illustrates the basic effect of coupling capacitors on recovery time, the time necessary for the amplifier to completely recover its gain following a pulse. FIG. 1A shows the output if the capacitors are large, and FIG. 1B shows the output if the capacitors are small. As can be seen, large capacitors produce little differentiation; however, the recovery time $T_r$ is long. Small capacitors produce excessive differentiation; however, the recovery time $T_r$ is small. The recovery time is also a function of the pulse width $t$ and increases as $t$ increases.

Selection of the optimum coupling capacitor depends on how long the pulse height must be a good representation of the logarithm of the input. One system may require a 100 nsec flat top allowing the use of small coupling capacitors, while another system may require a 10 $\mu$sec flat top mandating the use of large capacitors.

Duty cycle, D, is the minimum distance between input pulses for no attenuation due to the recovery time, and may be given as $$D = t \text{ (pulse time)}/T_r \text{ (recovery time)}$$

The maximum frequency (smallest D), $f_{max}$, may be given as $$f_{max} = 1/T_r$$

Substituting for $T_r$, $$f_{max} = D/t$$

Since capacitors cannot pass DC, the signal being amplified has low-frequency distortion, e.g., droop in the case of input pulses. The droop causes pulse undershoot that is amplified by the following stage. The undershoot, in turn, places an effective bias on the logarithmic stage. As a result, the duty cycle for pulses occurring during the undershoot is reduced. Thus, to increase the duty cycle all coupling capacitors must be eliminated.

SUMMARY OF THE INVENTION

The present invention is a logarithmic amplifier which has an improved duty cycle. The amplifier includes a plurality of direct coupled, rather than capacitive coupled, differential amplifiers. The outputs of the differential amplifiers are combined in a summing circuit which provides the logarithmic response output.

DESCRIPTION OF THE PREFERRED EMBODIMENT

Figure 1:
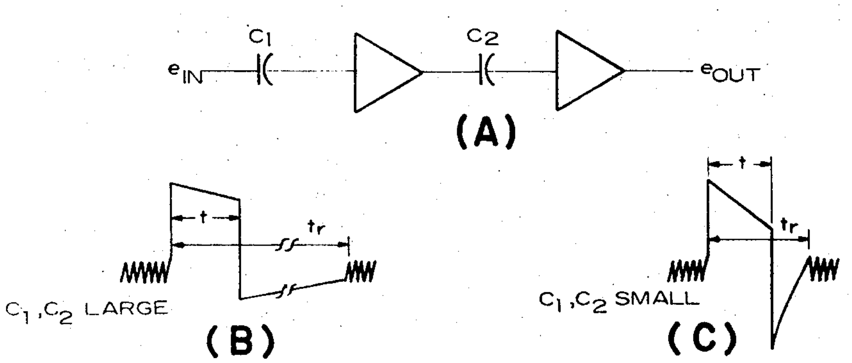
FIG. 1 is a schematic and response diagram of a typical amplifier utilizing capacitive coupling.

FIG. 1 shows the typical capacitive coupled amplifier and amplifier response wherein $T_r$ indicates the recovery time and $t$ indicates the pulse width. FIG. 1A shows the capacitive coupled circuit FIG. 1B the response if $C_1$ and $C_2$ are large; and FIG. 1C shows the response if $C_1$ and $C_2$ are small. $T_r$, in addition to being a function of the capacitive values as seen in FIG. 1, is a function of the pulse width t, i.e. , $T_r$ increases as $t$ increases.

Since the duty cycle D, the minimum distance between input pulses for no attenuation due to the recovery time, is given by $$D = t \text{ (pulse width)}/T_r \text{ (recovery time)}$$

a high duty cycle would be one which approached 1. The Duty cycle D approaches 1 as the pulse width $t$ approaches the recovery time $T_r$. Since capacitors cannot pass direct current, capacitive coupled amplifiers cause low frequency distortion. As a result, they have low duty cycles when processing pulse inputs.

Figure 2:
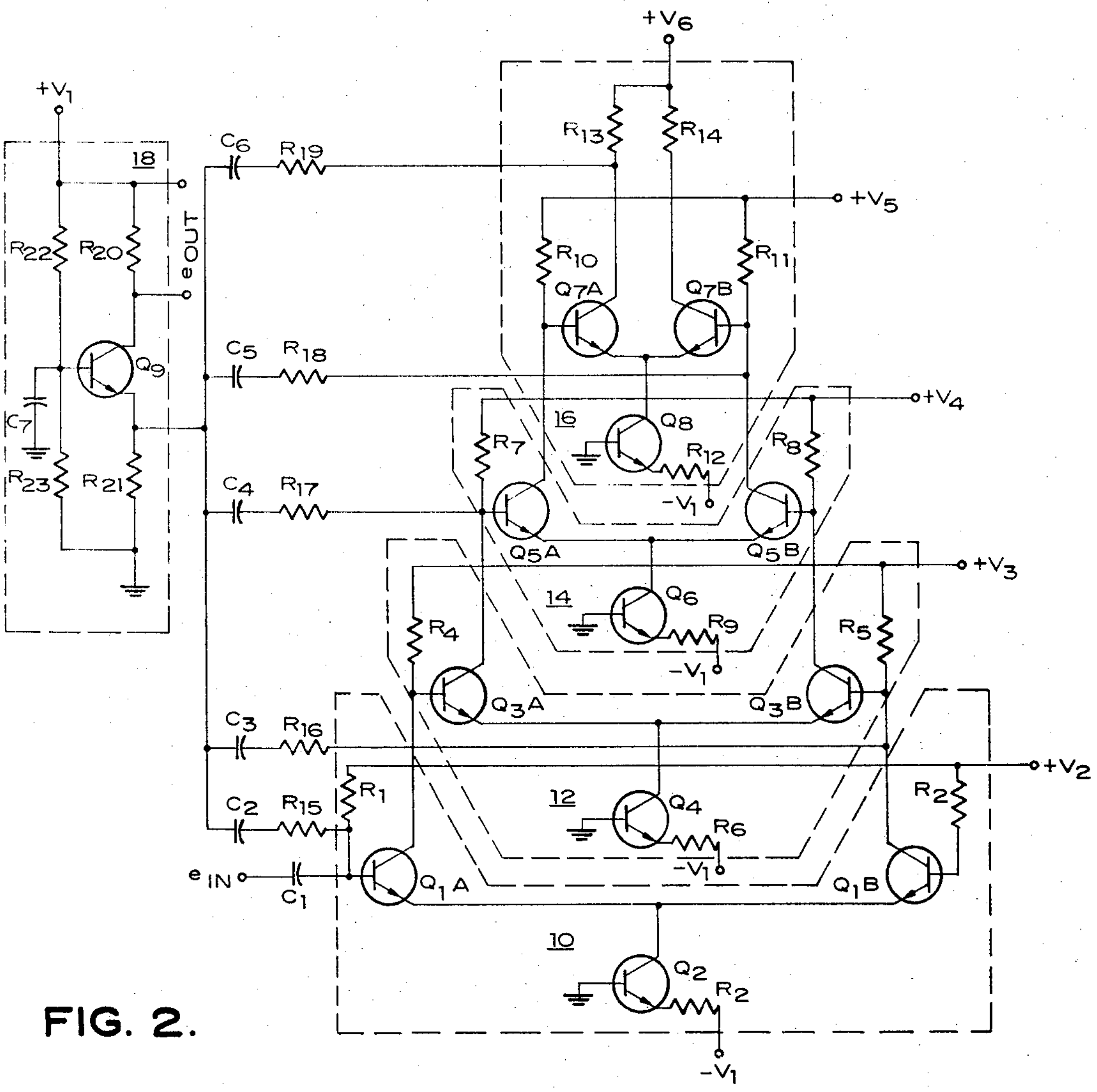
FIG. 2 is a schematic diagram of the present invention showing direct coupled differential amplifiers.

FIG. 2 shows the present invention which is simple and smaller than, and has a duty cycle far better than, prior units. The present invention includes a plurality of differential amplifiers such as differential amplifiers 10, 12, 14, and 16. The output of each differential amplifier is coupled to a summing circuit 18 for combining the outputs and providing the system output $e_{out}$ which is a logarithmic function of the input signal.

The input signal $e_{in}$, which may be a pulse, is coupled through capacitor $C_1$ to differential amplifier stage 10. Stage 10 includes transistor $Q_1$ having sections A and B, transistor $Q_2$, and resistors $R_1$, $R_2$, and $R_3$. The output of stage 10, taken at the base of transistor $Q_1$ section A, is coupled through resistor $R_{15}$ and capacitor $C_2$ to summing stage 18. Differential amplifier 12, 14, and 16 are coupled in cascade with, and are similar to, differential amplifier 10. The output of differential amplifier stage 12 is taken at the base of transistor $Q_3$ section B and coupled through resistor $R_{16}$ and capacitor $C_3$ to summing stage 18. Like differential amplifier 10, the output of differential amplifier 14 is taken at the base of section A of the transistor, in this case transistor $Q_5$; and like differential amplifier 12, the output of differential amplifier 16 is taken at the base of section B of the transistor, in this case transistor $Q_7$.

The present invention operates as follows. The lowest level differential amplifier, stage 10, provides a logarithmic response for low level inputs. As the input increases stage 10 limits and the next higher level differential amplifier, stage 12, yields a logarithmic response over its dynamic range. Likewise, differential amplifier 14 provides a logarithmic response over the next higher range; and differential amplifier 16 provides a logarithmic response over the range higher than that of stage 14. The process continues until the highest level log stage included in the system saturates. The output of summing amplifier 18 is the sum of the outputs of all the differential amplifier stages in the system and is a large range logarithmic response.

The following list of component types and values is offered by way of example only as one of many possible operative embodiments of the present invention.

| Symbol | Component | Type or Value |
|---|---|---|
| $C_1,C_2,C_3,C_4,C_5,C_6,C_7$ | Capacitor | 0.1μf |
| $R_1,R_2$ | Resistor | 1K, 1% |
| $R_3,R_6, R_9,R_{12}$ | Resistor | 4K, 1% |
| $R_4,R_5,R_7,R_8,R_{10},R_{11},R_{13},R_{14}$ | Resistor | 150Ω, 1% |
| $R_{20}$ | Resistor | 1K |
| $R_{21},R_{22},R_{23}$ | Resistor | 2K |
| $Q_1,Q_3,Q_5,Q_7$ | Transistor | ND918A |
| $Q_2,Q_4,Q_6,Q_8$ | Transistor | 2N929 |
| $Q_9$ | Transistor | 2N918 |
| $V_1$ | Supply Voltage | 12 volts |
| $V_2$ | Supply Voltage | 3 volts |
| $V_3$ | Supply Voltage | 4 volts |
| $V_4$ | Supply Voltage | 5 volts |
| $V_5$ | Supply Voltage | 6 volts |
| $V_6$ | Supply Voltage | 7 volts |

Since the logarithmic stages of the present invention are direct coupled, no pulse droop occurs. Therefore, the logarithmic stages are not biased by the preceding pulse. And, as a result, the duty cycle of the present invention is improved over that of prior devices.

The present invention may be fabricated in integrated circuits; thereby, saving in cost and size. And, the invention may include any number of differential amplifier stages; the more stages, the better the logarithmic approximation.

What is claimed is:

1. A transistorized amplifier providing an output signal which is a logarithmic function of the input signal, comprising:

a first stage having a first transistor, the base of which is coupled to said input signal, wherein said first stage is a logarithmic differential amplifier;

a second stage coupled to said first stage wherein said second stage includes at least one logarithmic differential amplifier, the first differential amplifier of which includes first and second transistors with the base of the first coupled to the collector of said first transistor of said first stage, and the emitters of the first and second transistors of each differential amplifier of said second stage being directly connected; and summing means coupled to the outputs of said first and second stages for combining their outputs and providing the system output;

wherein said first stage and second stage are direct coupled.

2. The amplifier of claim 1 wherein the collector of the second transistor of said first stage differential amplifier is connected to the base of the second transistor of the first differential amplifier of the second stage.

3. The amplifier of claim 2 wherein:

said second stage includes a plurality of differential amplifiers; and the collectors of the first and second transistors of each differential amplifier of the second stage are connected to the bases of the first and second transistors of the succeeding differential amplifier, respectively.

4. The amplifier of claim 2 wherein the output of said first stage is provided at the collector of said second transistor and the output of the first differential amplifier of the second stage is provided at the collector of said first transistor.

5. The amplifier of claim 4 wherein:

said second stage includes a plurality of differential amplifiers; and the output of the second differential amplifier of the second stage is provided at the collector of said second transistor, and the outputs of the succeeding odd numbered differential amplifiers of the second stage are provided at the collector of the first transistor and the outputs of the succeeding even numbered differential amplifiers of the second stage are provided at the collector of the second transistor.

6. The amplifier of claim 5 wherein:

the input signal is coupled to the summing means for extending the output dynamic range of the amplifier.

* * * * *